Figure 1:
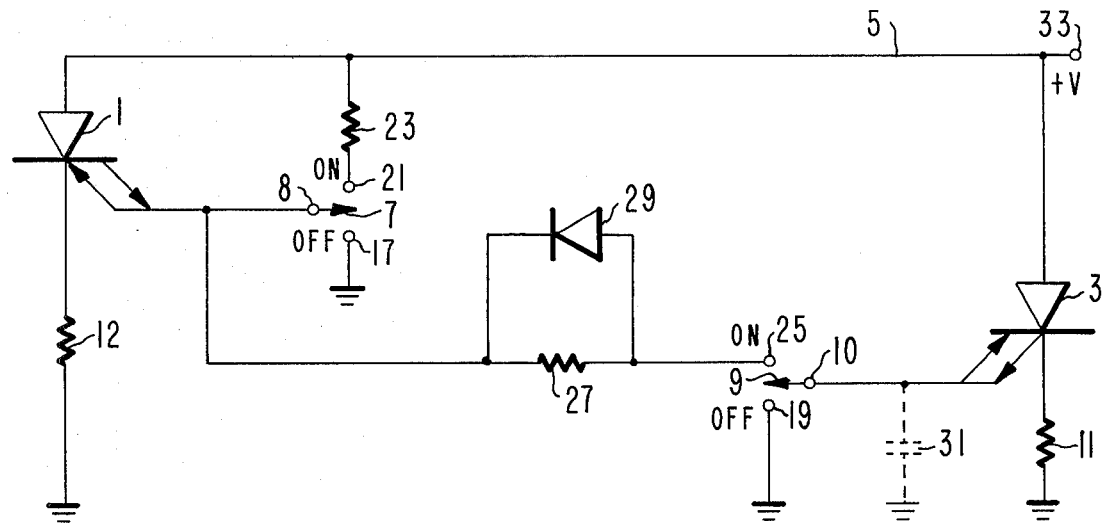

United States Patent [19]

Brooks

[11] 4,023,049
[45] May 10, 1977

[54] GTO SWITCHING CIRCUITS

[75] Inventor: Ronald Robert Brooks, Hamilton Square, N.J.

[73] Assignee: RCA Corporation, New York, N.Y.

[22] Filed: Feb. 9, 1976

[21] Appl. No.: 656,294

[52] U.S. Cl. .................... 307/252 C; 307/284; 323/22 SC; 323/23; 340/76; 315/83

[51] Int. Cl.² ................ H03K 17/60; H03K 17/72

[58] Field of Search ....... 307/252 R, 252 C, 252 K, 307/305, 10 LS, 284; 323/22 SC, 23; 315/83; 340/76, 81 R, 340

[56] References Cited
UNITED STATES PATENTS 3,292,035  12/1966  Lee ..................................... 315/83
3,484,626  12/1969  Grafham ............................ 307/305

Primary Examiner—John Zazworsky
Assistant Examiner—Marcus S. Rasco
Attorney, Agent, or Firm—H. Christoffersen; S. Cohen; K. Watov

[57] ABSTRACT

When a gate-turn-off silicon controlled rectifier (GTO) is turned on, the potential of its gate electrode rises toward the voltage at its anode electrode. This gate voltage is employed to turn on a second GTO to insure that the loads driven by these GTO's are energized in a particular order. Switches in the circuit permit the GTO's to be turned off concurrently or in any order desired. A charge storage circuit may be included for controlling the turn-on delay between the two GTO's.

17 Claims, 2 Drawing Figures

GTO SWITCHING CIRCUITS

This invention relates generally to switching circuits, and more particularly to switching circuits including gate-turn-off silicon controlled rectifiers for switching load currents.

There are many electrical systems—a modern automotive headlight control system is one example, which require the activation and inactivation of first and second loads (such as low and high beam headlights), in a particular sequence. For example, it may be desired to prevent the application of power to the second load until after the first load has been turned on. It may also be desired to permit the first load to remain on when the second load is turned off, but to automatically turn off the second load when the first load is turned off, at the same time that the first load is turned off. Headlight control systems generally use mechanical switching means to perform these functions. A disadvantage of such systems is that, in time, the inductive load presented by the headlights may cause pitting of the switch contacts, reducing the reliability of the switching system. Also, the gauge of the wire running from the dashboard of the vehicle to the headlights, for example, must be sufficient to handle the current supplied to the headlights. Automotive manufacturers generally strive to reduce the bulk of the electrical cabling required for their electrical systems, and also strive to increase the reliability and reduce the cost of such switching circuits or systems.

A switching circuit embodying the invention includes a pair of gate-turn-off silicon controlled rectifiers. One GTO, when turned on, serves as a voltage source for turning on the other GTO. Means may be included to control the delay time between the turn on of the two rectifiers. Means may be provided for turning off the GTO's concurrently or in any desired sequence.

Figure 2:
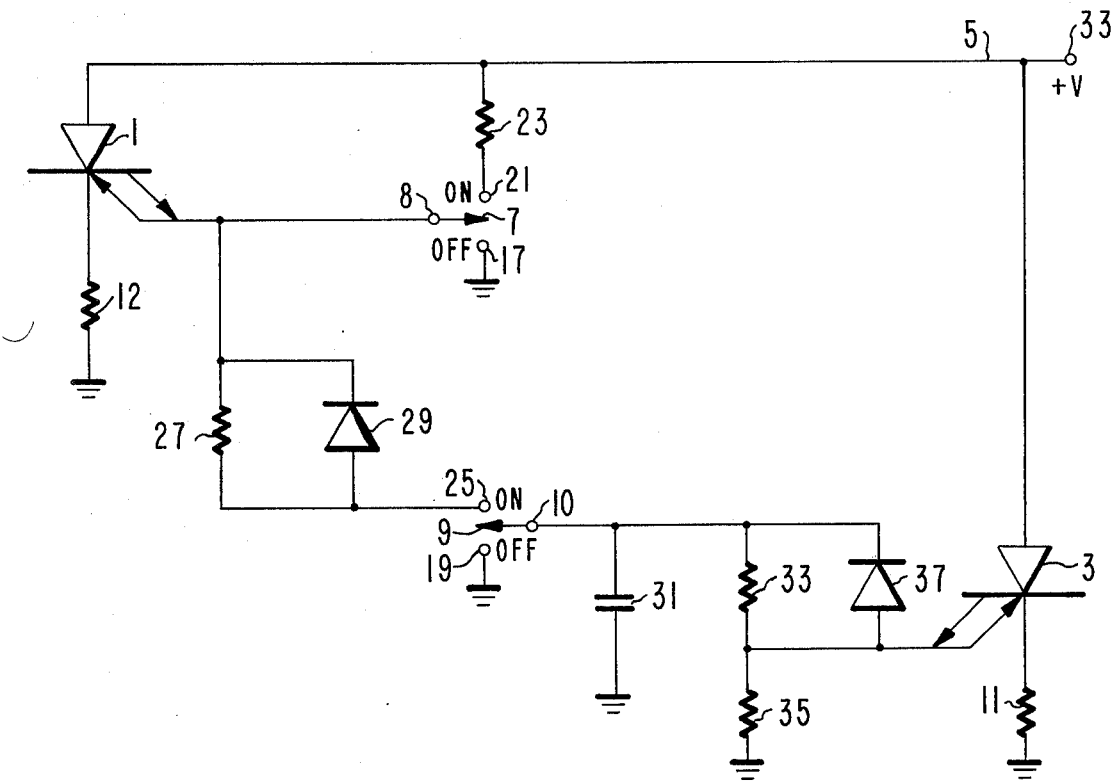

In the drawing:

FIG. 1 is a schematic diagram of a switching circuit embodying one form of the present invention; and FIG. 2 is a schematic diagram of a switching circuit embodying another form of the invention.

In FIG. 1, first and second gate-turn-off silicon controlled rectifiers (hereinafter referred to as GTO's) 1, 3, each have an anode electrode connected to a positive voltage bus 5 and a gate electrode. The gate electrode of GTO 1 is connected to the pole of a first switch 7 and the gate of GTO 3 is connected to the pole of a second switch 9. The cathode electrodes of GTO's 1 and 3 are connected via load impedances 12 and 11, respectively, to a point of reference potential, ground in this example. First contacts 17 and 19 of the switches 7 and 9, respectively, are connected to ground. A second contact 21 of the switch 7 is connected via a resistor 23 to the positive voltage supply bus 5. A second contact 25 of the switch 9 is connected via resistor 27 to the gate electrode of the GTO 1. A diode 29 connected in parallel with the resistor 27, has an anode electrode connected to the second contact 25 of the switch 9. A capacitor 31, shown in phantom, may be connected between the gate electrode of the GTO 3 and ground. The positive voltage supply bus 5 is connected to a power terminal 33, for connection to a positive voltage supply.

The circuit of FIG. 2 is substantially identical to that of FIG. 1, except for the addition in the circuit of FIG. 2 of a resistive voltage divider formed by two resistors 33 and 35 connected between pole 10 and ground, and a diode 37 connected between pole 10 and the gate electrode of GTO 3. Diode 37 is connected in parallel with resistor 33 and its anode electrode is connected to the gate electrode of GTO 3.

With reference to FIG. 1, GTO 1 is turned on by operating switch 7 to connect the pole 8 to contact 21, thereby providing a turn-on signal at the gate electrode of GTO 1, via the flow of current from the positive bus 5 through a first direct current conduction path including resistor 23, and switch 7, into the gate electrode of GTO 1. The value of resistor 23 is chosen to insure that sufficient current flows into the gate electrode of GTO 1 to turn it on. When GTO 1 turns on, the resistance of the main current path between its anode and cathode electrodes, changes from a relatively high value to a relatively low value, permitting current to flow via this path to load 12, energizing the load.

To turn off GTO 1, switch 7 is operated to connect pole 8 to contact 17, providing a second direct current conduction path whereby current flows from the gate electrode of GTO 1 to ground. It should be mentioned that turn-off is not obtained simply by placing pole 8 in its neutral position. Once a GTO has been turned on via the application of a turn-on signal at its gate electrode, the turn-on signal may be removed without affecting the continued operation of the GTO. Accordingly, in the normal operation of this circuit, after the GTO 1 has been turned on, switch 7 may be returned to its neutral state.

To turn on GTO 3, switch 9 must be operated to position pole 10 at contact 25, and concurrently, or thereafter switch 7 must be operated to switch pole 8 to contact 21. Assume the operation of the two switches is concurrent. The combined values of resistors 23 and 27 are such that insufficient current flows from the positive bus 5 into the gate electrode of GTO 3, to turn on that GTO. However, when GTO 1 turns on, the potential of its gate electrode rises toward the voltage +V of bus 5 and shortly attains a value roughly one volt less than +V. In this condition, the gate electrode of GTO 1 acts as a voltage source and causes sufficient current flow via resistor 27 to the gate electrode of GTO 3, to turn on GTO 3. The sequential turn on of GTO's 1 and 3 also occurs if switches 7 and 9 are turned on in sequence with 7 being turned on first. Clearly, once GTO 1 turns on, GTO 3 can be turned on by closing switch 9 to contact 25. During the turn on cycle of GTO 3, diode 29 will be backbiased, and as a result be nonconductive.

AS should be clear from the above, when switches 9 and 7 are operated in the manner discussed, the turn on of GTO 3 will be delayed until GTO 1 has been turned on. However, if GTO 3 is off and if pole 10 of switch 9 is in either the neutral position or at contact 19, then GTO 1 can be turned on without affecting GTO 3. With GTO 1 on, if switch 9 is operated to place pole 10 at contact 25, GTO 3 will turn on with substantially no delay. As in the operation of GTO 1, once GTO 3 has been turned on, switch 9 can be operated to place pole 10 in the neutral position, without affecting the continued operation of GTO 3. When GTO 3 turns on, current flow from the positive bus 5 through its main current path, to load 11.

Once turned on, the GTO 1 may be turned off by operating switch 7 to connect pole 8 to contact 17, whereby current will be conducted from the gate electrode of GTO 1 to ground, turning off this GTO. Similarly, GTO 3 may be turned off by operation of switch 9 to position pole 10 at contact 19, whereby current will be conducted from the gate electrode of GTO 3 to ground for turning off that GTO. When GTO's 1 and 3 are both turned on, GTO 3 may be turned off substantially simultaneously with GTO 1 by first operating switch 9 to place pole 10 at contact 25, if switch 9 is not already in this position, and thereafter operating switch 7 to place pole 8 at contact 17. With switches 7 and 9 in these positions, current will flow from the gate electrode of GTO 1 through switch 7 to ground, turning off GTO 1, and current will flow from the gate electrode of GTO 3 through switch 9 and the now forward biased diode 29 to ground, turning off GTO 3. The resistance of resistor 27 in parallel with diode 27 is much higher than that of the diode.

If GTO's 1 and 3 are both initially on and switch 9 is in its neutral position, GTO 1 can be turned off while GTO 3 remains on. This can be done by placing pole 8 of switch 7 in contact with terminal 17. If after GTO 1 has turned off, switch 9 is now operated to place pole 10 at contact 25, current will flow from the gate electrode of GTO 3 through the current path including switch 9, the parallel combination of diode 29 and resistor 27, and switch 7 to ground, turning off GTO 3. GTO 3 also can be turned off by placing pole 10 in contact with contact 19.

Certain applications may require that the turn on of GTO 3 be delayed after switches 7 and 9 have been operated as described previously, for turning on GTO's 1 and 3. One means of providing such a controlled delay is to include capacitor 31 (shown in phantom) between the gate electrode of GTO 3 and ground. When switches 7 and 9 are operated to close the current paths from the gate electrode of GTO 3 to the gate electrode of GTO 1, and to the power bus or positive voltage bus 5, capacitor 31 will begin charging, causing the voltage at the gate electrode of GTO 3 to exponentially increase from ground. In a predetermined time period, the voltage across capacitor 31 will attain a level sufficient to turn on GTO 3. The rate of charge or time contact for capacitor 31 is controlled by the values of resistors 23 and 27 just before GTO 1 turns on, and after GTO 1 has turned on, the time constant is controlled by the combined resistance of resistor 27 plus the resistance of resistor 23 in parallel with the resistance across the anode gate junction of GTO 1 (assuming pole 8 to be in contact with 21). When switch 9, or switches 9 and 7 are operated to turn off GTO 3 as previously described, capacitor 31 will discharge to ground. If switch 9 is operated to connect the pole 10 to contact 19, capacitor 31 will discharge to ground through switch 9. If, on the other hand, pole 10 is engaged with contact 25 and pole 8 with contact 17, capacitor 31 will discharge primarily through the current path including switch 9, diode 29 bypassing resistor 27 (diode 29 is now conductive and forward-biased, and therefore has a very low resistance relative to the resistance of resistor 27), and switch 7, to ground. As capacitor 31 discharges, the voltage across capacitor 31 will, of course, decrease exponentially. When the voltage across capacitor 31 decreases to a value less than the voltage drop across the load 11, current will begin flowing from the gate electrode of GTO 3 to ground as previously described, initiating the turn off of GTO 3.

In FIG. 2, a resistive voltage divider 33, 35 has been added to the circuit of FIG. 1, to increase the delay time in turning on GTO 3, without increasing the value of capacitor 31. Whereas in the previous circuit the full voltage developed across the capacitor 31 is applied to the gate electrode of GTO 3, here only a fraction of this voltage (dependent on the relative values of resistors 33 and 35) is so applied. Therefore, capacitor 31 must be charged to a higher level than in the circuit of FIG. 1, and this will take a longer time, to obtain a voltage at the gate electrode of GTO 3 of sufficient value to turn on that GTO. During turn off of GTO 3, as described previously, diode 37 is included to provide a relatively low resistance shunt or conduction path across resistor 33, for reducing the resistance to ground in the current path conducting current from the gate electrode of GTO 3 to ground, thereby enhancing or insuring the turn off of GTO 3. As previously described, diode 29 in combination with resistor 27, is providing the same function as diode 37 across resistor 33.

In other respects the operation of the circuits of FIGS. 1 and 2 is similar. In both circuits, load 11 cannot be energized until after load 12 has been energized (load 11 may, for example, be a high-beam circuit and load 12 a low-beam circuit). In both circuits, load 11 may be energized while load 12 remains off. In both circuits, load 12 can be turned off while load 11 remains energized and, alternatively, load 11 can be turned off while load 12 remains energized. Both circuits are applicable for use in controlling the headlights of an automobile, for example. GTO's 1 and 3 may, in such an application, be located near the headlights they are to control. The gate control wires for these GTO's 1, 3, may be run back to the dashboard, and floorboard, where switches 7 and 9, respectively, are located with other elements of the circuit (resistors 23, 27 and diode 29). The wire gauge of these gate control wires may be substantially reduced (each one conducts only a low magnitude gate current), relative to the gauge of the wires required in present mechanical systems, for conducting the full load current from the switches to the headlights.

While the circuits of FIGS. 1 and 2 illustrate the invention in terms of only two GTO's, it is to be understood that this is intended as an illustration only. The invention is equally applicable to three, four or a higher number of GTO's. In all of these circuits the loads driven by the GTO's can be energized only in one sequence, that is each GTO (and its load) after the first can be energized only after the preceding GTO has been turned on, but can be turned off in any sequence.

What is claimed is:

1. A circuit for sequentially energizing first and second loads, comprising:
   first and second terminals for receiving an operating voltage therebetween;
   first and second gate-turn-off silicon controlled rectifiers each having an anode electrode connected to said first terminal, a cathode electrode, and a gate electrode, said first and second loads being individually connected between said second terminal and the cathode electrodes of said first and second rectifiers, respectively;
   means for selectively completing one of a first direct current conductive path between the gate electrode of said first rectifier and said first terminal, and a second direct current conductive path between the gate electrode of said second rectifier and said second terminal, said first path including current limiting means; for enabling conduction in said first rectifier when said first path is completed, the conduction of said first rectifier causing its gate voltage to be at about the same level as the voltage at said first terminal, and for discontinuing conduction of said first rectifier when the second of said paths is completed, causing the level of voltage at the gate of said first rectifier to be at about the voltage at said second terminal; and means connected to respond to the voltage at said gate electrode of said first rectifier having a value about equal to the voltage at said first terminal for supplying sufficient turn-on current to the gate electrode of said second rectifier for enabling conduction of said second rectifier, and responsive to the voltage at said gate electrode of said first rectifier having a value about equal to the voltage at said second terminal for discontinuing conduction of said second rectifier.

2. The circuit of claim 1 further including means coupled between said gate electrode of said second rectifier and said second terminal, for delaying the enabling of said second rectifier, for a given period of time after said first rectifier is enabled.

3. The circuit of claim 1, wherein said means for selectively completing one of the first and second direct current conductive paths comprises a switch having a pole connected to the gate electrode of said first rectifier, a first contact connected via said current limiting means to said first terminal, and a second contact connected to said second terminal; and wherein said means responsive to the voltage at said gate electrode of said first rectifier comprises means for connecting the pole of said switch to the gate electrode of said second rectifier.

4. The circuit of claim 3, wherein said means for connecting the pole of said switch to the gate electrode of said second rectifier is a resistor; and wherein a diode is connected in shunt with said resistor and poled to be reverse biased by said voltage at the gate electrode of said first rectifier having a value about equal to the voltage at said first terminal.

5. The circuit of claim 4, wherein said means for connecting further includes a second switch which in one condition closes the path between said two gate electrodes and in a second condition opens said path.

6. The circuit of claim 5, wherein said second switch includes a third condition in which it connects the gate electrode of said second rectifier to said second terminal.

7. The circuit of claim 2, wherein said delay means comprises a capacitor connected between said second terminal and said gate electrode of said second rectifier.

8. The circuit of claim 2, wherein said delay means includes:
a first resistor connected between said gate electrode of said second rectifier and said second terminal;
a second resistor connected in a series circuit with and between the gate electrode of said second rectifier and said responsive means;
a capacitor connected between said second terminal and the common connection of said second resistor and said responsive means; and
a diode connected in shunt with said second resistor and poled to be reverse biased by said voltage at the gate electrode of said first rectifier.

9. A sequential switching circuit comprising:
first and second terminals across which a source of voltage may be connected;
a first gate-turn-off silicon controlled rectifier having an anode electrode connected to said first terminal, a cathode electrode connected to one terminal of a first load, the other terminal of said load being connected to said second terminal, and a gate electrode;
first switching means for, in one condition, coupling said gate electrode to said first terminal for turning on said first rectifier, and for, in a second condition, coupling said gate electrode to said second terminal for turning off said rectifier;
a second gate-turn-off silicon controlled rectifier having an anode electrode connected to said first terminal, a cathode electrode connected to one terminal of a second load, the other terminal of said second load being connected to said second terminal, and a gate electrode; and
second switching means for, in one condition, coupling said gate electrodes of said first and second rectifier together, for turning on said second rectifier in response to the turn on of said first rectifier, and for, in a second condition, connecting the gate electrode of said second rectifier to said second terminal for turning-off said rectifier independently of said first rectifier.

10. The switching circuit of claim 9, wherein said first switching means includes:
first resistive means; and
a first switch having a pole connected to the gate electrode of said first rectifier, a first contact connected via said resistive means to said first terminal, and a second contact connected to said second terminal.

11. The switching circuit of claim 10, wherein said second switching means includes:
second resistive means; and
a second switch having a pole connected to the gate electrode of said second rectifier, a first contact connected via said second resistive means to the gate electrode of said first rectifier, and a second contact connected to said second terminal.

12. The switching circuit of claim 11, wherein said second switching means further includes unidirectional current means connected in parallel with said second resistive means, and poled for providing a low resistance current path for current flowing from the gate electrode of said second rectifier to said first switching means.

13. The sequential switching circuit of claim 9, further including means connected between the gate electrode of said second rectifier and said second terminal, for delaying the turn on of said second rectifier after both said first rectifier is turned on and said second switching means is operated to couple the gate electrodes of said rectifiers together.

14. The sequential switching circuit of claim 13, wherein said delay means includes a capacitor connected between the gate electrode of said second rectifier and said second terminal.

15. The sequential switching circuit of claim 13, wherein said delay means includes:
voltage divider means connected between said second switching means and said second terminal, having an output terminal connected to the gate electrode of said second rectifier; and a capacitor connected in parallel with said voltage divider means.

16. The sequential switching circuit of claim 15, wherein said voltage divider means includes:
a pair of resistors connected in series, the common connection between said resistors being said output terminal; and
a diode connected between the gate electrode of said second rectifier and said second switching means, said diode being poled to provide a low resistance conduction path for the flow of current from said gate electrode of said second rectifier to said second switching means.

17. The switching circuit of claim 11, further comprising:

third resistive means for connecting the pole of said second switch to the gate electrode of said second rectifier; and
first and second unidirectional current means connected across said second and third resistive means, respectively, and each of said first and second unidirectional current means being poled for providing a low resistance current path for the flow of current from the gate electrode of said second rectifier to said second terminal for the concurrent conditions of said first and second switches where the pole of said first switch is electrically contacting its second contact and the pole of said second switch is electrically contacting its first contact, for turning off said second rectifier at substantially the same time said first rectifier is turned off.

* * * * *